US011762070B2

(12) United States Patent
Matsui et al.

(10) Patent No.: US 11,762,070 B2
(45) Date of Patent: Sep. 19, 2023

(54) DISTANCE MEASURING DEVICE AND DISTANCE MEASURING METHOD

(71) Applicants: OMRON Corporation, Kyoto (JP); Politecnico di Milano, Milan (IT)

(72) Inventors: Yuki Matsui, Kyoto (JP); Ken Nakamuro, Kyoto (JP); Franco Zappa, Milan (IT); Federica Villa, Milan (IT); Rudi Lussana, Milan (IT)

(73) Assignees: OMRON Corporation, Kyoto (JP); Politecnico di Milano, Milan (IT)

( * ) Notice: Subject to any disclaimer, the term of this patent is extended or adjusted under 35 U.S.C. 154(b) by 467 days.

(21) Appl. No.: 16/543,664

(22) Filed: Aug. 19, 2019

(65) Prior Publication Data
US 2020/0064451 A1   Feb. 27, 2020

(30) Foreign Application Priority Data
Aug. 21, 2018  (EP) ..................................... 18425071

(51) Int. Cl.
*G01S 7/487*  (2006.01)
(52) U.S. Cl.
CPC ................... *G01S 7/4873* (2013.01)
(58) Field of Classification Search
CPC ...... G01S 7/4873; G01S 7/4915; G01S 17/00; G01S 17/08; G01S 17/89; G01S 17/931; G01S 19/13; G01S 19/23
See application file for complete search history.

(56) References Cited

U.S. PATENT DOCUMENTS

| 9,014,551 B1* | 4/2015 | Stooke ................... H04B 10/17 |
| 2012/0249998 A1 | 10/2012 | Eisele et al. |

(Continued)

FOREIGN PATENT DOCUMENTS

| CN | 104793215 A | 7/2015 |
| CN | 106461781 A | 2/2017 |

(Continued)

OTHER PUBLICATIONS

The Office Action (JPOA) dated Oct. 1, 2020 in a counterpart Japanese patent application.

(Continued)

*Primary Examiner* — Luke D Ratcliffe
(74) *Attorney, Agent, or Firm* — METROLEX IP LAW GROUP, PLLC

(57) ABSTRACT

A distance measuring device includes a light emission portion for emitting light; a light receiving portion for receiving measurement light that is emitted by the light emission portion and reflected by a measurement object, the light receiving portion comprising a plurality of pixels, each pixel having at least one light receiving portion and outputting a light reception signal that depends on the measurement light incident on the pixel; a discrimination portion for discriminating whether the pixel receives measurement light; a pixel output control portion for selectively outputting the light reception signal of each pixel individually, depending on the determination result of the discrimination portion; and an evaluation portion for receiving the light reception signals output by the pixel output control portion and outputting a distance signal that is indicative of a distance between the measuring device and the measurement object based on these light reception signals.

17 Claims, 11 Drawing Sheets

(56) References Cited

U.S. PATENT DOCUMENTS

| | | | |
|---|---|---|---|
| 2013/0182160 A1* | 7/2013 | Pitter | H04N 25/77 |
| | | | 348/296 |
| 2015/0204980 A1 | 7/2015 | Matsuura | |
| 2015/0271476 A1 | 9/2015 | Wan et al. | |
| 2016/0003946 A1* | 1/2016 | Gilliland | G01S 17/894 |
| | | | 356/5.01 |
| 2016/0209498 A1* | 7/2016 | Kanter | G01S 7/487 |
| 2017/0115392 A1 | 4/2017 | Mase et al. | |
| 2017/0139041 A1* | 5/2017 | Drader | G01S 7/487 |
| 2017/0257617 A1* | 9/2017 | Retterath | H04N 13/257 |
| 2018/0120423 A1 | 5/2018 | Nishikawa et al. | |
| 2018/0259645 A1* | 9/2018 | Shu | H01L 31/107 |
| 2018/0313938 A1 | 11/2018 | Okada | |
| 2019/0217864 A1* | 7/2019 | Kusukame | G01C 21/3691 |

FOREIGN PATENT DOCUMENTS

| | | |
|---|---|---|
| CN | 107615010 A | 1/2018 |
| CN | 107710015 A | 2/2018 |
| DE | 102016011913 A1 | 4/2018 |
| EP | 2708913 A1 | 3/2014 |
| JP | 2014-077658 A | 5/2014 |
| JP | 2016176750 A | 10/2016 |
| WO | 2010/149593 A1 | 12/2010 |

OTHER PUBLICATIONS

The extended European search report (EESR) dated May 27, 2019 in a corresponding European patent application.

The partial European search report dated Mar. 6, 2019 in a corresponding European patent application.

The Office Action dated Jun. 10, 2020 in a corresponding European patent application.

The Office Action (CNOA) dated Jan. 19, 2023 in a counterpart Chinese patent application.

The Office Action dated May 27, 2021 in a counterpart Japanese patent application, with English translation.

\* cited by examiner

|  | $T_{M1}$ | $T_{P1}$ | $T_{M2}$ | $T_{P2}$ | $T_{M3}$ | $T_{P3}$ | $T_{M4}$ | $T_{P4}$ | $T_{M5}$ | $T_{P5}$ | $T_{M6}$ | $T_{P6}$ |
|---|---|---|---|---|---|---|---|---|---|---|---|---|
| Inside spot | +1 | 0 | +1 | -1 | 0 | -1 | +1 | 0 | +1 | -1 | +1 | 0 |
| outside spot | 0 | -1 | +1 | -1 | +1 | 0 | 0 | -1 | 0 | 0 | +1 | 0 |

… # DISTANCE MEASURING DEVICE AND DISTANCE MEASURING METHOD

FIELD OF THE INVENTION

The present invention relates to a distance measuring device, and more specifically to a distance measuring device comprising a light receiving portion having a plurality of pixels, as well as to a measurement method using the distance measuring device.

TECHNICAL BACKGROUND

A variety of distance measuring devices are known, in which measurement light is incident on a light reception area constituted by an array of light reception elements or pixels. Such distance measuring devices are used for example as distance sensors that evaluate the time of flight of a light beam that is emitted from the distance measuring device, reflected by the measurement object and received with the light reception area of the distance measuring device.

If the pixels receive not only the measurement light but also ambient or stray light, then this may falsify or corrupt the determination of the distance to the measurement object performed by the distance measuring device.

JP 2014-77658 A discloses an optical distance measuring device comprising a light source that projects irradiation light, light reception means that receive the reflection light from the object and is provided with a plurality of photodiodes in which each photodiode can be independently turned off, and addition means that adds an output of the plurality of photodiodes.

It is one object of the present invention to mitigate the influence of ambient light on the measurement result and to improve the accuracy of the distance measuring device.

SUMMARY OF THE INVENTION

According to one aspect of the present invention, a distance measuring device comprises:
  a light emission portion configured to emit light;
  a light receiving portion configured to receive measurement light that is emitted by the light emission portion and reflected by a measurement object, the light receiving portion comprising a plurality of pixels, each pixel having at least one light receiving portion and being configured to output a light reception signal that depends on the measurement light incident on the pixel;
  a discrimination portion configured to discriminate whether the pixel receives measurement light;
  a pixel output control portion configured to selectively output (forward) the light reception signal of each pixel individually, depending on the determination result of the discrimination portion; and
  an evaluation portion configured to receive the light reception signals output (forwarded) by the pixel output control portion and to output a distance signal that is indicative of a distance between the measuring device and the measurement object based on these light reception signals.

The light emission portion may emit the light as pulses. In that case, the measurement light may also take the form of pulses. In particular, the pulses of the received measurement light are delayed in time with respect to the pulses of the emitted light. A time of flight of the measurement light, which corresponds to the time it takes for the light to travel from the distance measuring device to the measurement object and back, can be determined from the time delay of the pulses. The distance to the measurement object may be calculated as a characteristic of the measurement object based on the time of flight. In addition to the distance to the measurement object, other properties or characteristics of the measurement object, such as its shape, color, reflectivity and/or luminescence, can be determined by the distance measuring device.

The light that is received by the light receiving portion may include not only light that is reflected once by the measurement object, but also light that is reflected multiple times, diffused light, scattered light, background light from the environment, light that is transmitted through the measurement object and then reflected, or otherwise returned to the light receiving portion.

Here, "distance signal that is indicative of a distance" may mean any signal that contains information that allows the specification of the distance. Examples of such signals are digital signals representing the measured distance or the time of flight of the returned light beam ("time of flight") and analog signals whose amplitude is proportional to the measured distance or the time of flight.

The light reception signal can be indicative of a light amount incident on the pixel and/or of a light intensity of the light incident on the pixel. The pixel output control portion may be configured to forward the light reception signal of those pixels for which the discrimination portion determines that measurement light is received. In particular, the pixel output control portion may be configured to not forward the light reception signal of all other pixels of the light receiving portion (e.g., those receiving only ambient light or background noise, or just a lower signal intensity). This increases the signal-to-noise ratio and thus improves the measurement accuracy. In particular, the light reception signals that are not forwarded are not taken into account for the measurement result.

The distance measuring device may further comprise an evaluation portion configured to receive the light reception signals forwarded by the pixel output control portion and to determine a distance between the measuring device and the measurement object based on these light reception signals. The evaluation portion may be configured to output a signal that is indicative of that distance.

The evaluation portion may determine the distance between the measuring device and the measurement object based on only the light reception signals forwarded by the pixel output control portion. In particular, only the light reception signals from the pixels that do receive measurement light are taken into account when determining the distance to the measurement object. That way, the measurement can be performed with higher accuracy, because signals resulting from ambient light are disregarded.

The discrimination portion may comprise a detection portion for detecting whether light is received at a pixel connected to the discrimination portion (also referred to as "associated pixel" below) during a plurality of first predetermined time intervals during a predetermined time period and during a plurality of second predetermined time intervals during the predetermined time period; and, for example, a counting portion for counting the number of times that the detection portion detects reception of light during the first predetermined time intervals and during the second predetermined time intervals during the predetermined time period; wherein the discrimination portion is configured to determine whether each pixel receives measurement light based on a counting result of the counting portion. The detection portion may detect that a light signal is received during the first or second predetermined time interval when at least one photon or at least a predetermined number of photons is detected at the associated pixel during the first or second predetermined time interval. The ambient light arriving on a pixel can take the form of randomly scattered photons. At a pixel receiving only ambient light, the probability of receiving a photon at any time during the predetermined time period is substantially constant. That is to say, the ambient light may fluctuate over time or vary spatially, but can be regarded as constant for the purposes of distance detection, as long as such variations do not substantially affect the distance measurement. In other words, the distribution of received ambient light photons is spatially and/or temporally different from the distribution of the measurement light.

In particular, for constant, uniform ambient light, the probability of receiving a photon at any time during the predetermined time period is constant while measurement light is received only during predetermined time intervals, so that the probability of receiving a photon during those time intervals is not constant. In other words, the distribution of received measurement light photons is not constant. Counting or discriminating how often a light signal is received during the first or second predetermined time interval of the predetermined time period is indicative of the type of light that is received at a given pixel, i.e. whether measurement light or only stray light is received.

The discrimination portion may be configured to determine that a pixel receives measurement light if the number (or distribution) of times that the detection portion detects a reception of light during the first predetermined time intervals during the predetermined time period differs from the number (or distribution) of times that the detection portion detects reception of light during the second predetermined time intervals during the predetermined time period by at least a predetermined comparison threshold. If a pixel receives measurement light, the distribution of the received photons is in particular not constant (and differs from the case of receiving only ambient light). The number (or distribution) of times at which a light signal is received during the first predetermined time interval is thus expected to be significantly different from the number (or distribution) of times at which a light signal is received during the second predetermined time interval. The comparison of the number (or distribution) of times at which a light signal is received during the first predetermined time interval and the number of times at which a light signal is received during the second predetermined time interval can hence provide an indication on whether measurement light or only ambient light is received at the pixel.

In some embodiments, the discrimination portion is configured to determine that a pixel receives measurement light if a count of the number of times that the detection portion detects reception of light during the first predetermined time intervals during the predetermined time period is smaller than an absolute or self-adjusting threshold and if the count of the number of times that the detection portion detects reception of light during the second predetermined time intervals during the predetermined time period is larger than the absolute or self-adjusting threshold, or vice versa.

The discrimination portion may be configured to determine that a pixel does not receive measurement light if the count of the number of times that the detection portion detects reception of light during the first predetermined time intervals during the predetermined time period differs from the count of the number of times that the detection portion detects reception of light during the second predetermined time intervals during the predetermined time period by less than the predetermined comparison threshold.

The first predetermined time intervals and/or the second predetermined time intervals may be periodic. Thereby, the precision of the measurement may be improved. Moreover, the length of the first predetermined time interval may be the same as a duration of the second predetermined time interval. However, different timings or durations can be also implemented and are covered by another embodiment. For example, the first predetermined time intervals and/or the second predetermined time intervals can be pseudo-random intervals.

The distance measuring device may further comprise a weighting portion for assigning a first weight to the counts of each first predetermined time interval at which the detection portion detects reception of light and/or for assigning a second weight to the counts of each second predetermined time interval at which the detection portion detects reception of light during the second predetermined time intervals. For example, the weighting portion may associate the number "+1" to every first predetermined time interval during which a light signal is detected and the number "−1" to every second predetermined time interval during which a light signal is detected. The number "0" may be associated to first and second predetermined time intervals during which no light signal is detected at all. The difference between the number of times that the light signal is detected during the first predetermined time interval and the number of times that the light signal is detected during the second predetermined time interval can then be easily determined by simply adding up these weighted counts.

The counting portion may further be configured to sum up the weighted counts of the first predetermined time intervals and to sum up the weighted counts of the second predetermined time intervals. The result of addition of the weights of the first predetermined time intervals and of the weights of the second predetermined time intervals allows to easily compare the number of times that the detection portion detects reception of light during the first predetermined time intervals to the number of times that the detection portion detects reception of light during the second predetermined time intervals and to determine whether measurement light is received therefrom.

A plurality of pixel output control portions may be connected to a single evaluation portion. Furthermore, a discrimination portion and a pixel output control portion may be provided for each pixel. The light reception signals forwarded by several pixel output control portions may be fed to a single evaluation portion. It is possible that all pixel output control portions are connected to a single evaluation portion. Moreover, the plurality of pixel output control portions may be connected to a single discrimination portion.

The discrimination portion may receive the light reception signal of each of a plurality of pixels. More specifically, a plurality of pixels may be connected to the same discrimination portion such as to provide the discrimination portion with their light reception signals. The discrimination portion receiving light reception signal of each of a plurality of pixels may also be connected to a single output control portion connected to a single evaluation portion. The light receiving portions constituting the pixels may be single photon avalanche diodes.

The plurality of pixels connected to the same discrimination portion may be non-adjacent to each other. Non-adjacent pixels can be non-neighboring pixels having at least one other pixel arranged between them. In particular, there is no direct path between non-adjacent pixels that does not cross any other pixel provided between the non-adjacent pixels.

A measurement method for performing a measurement using the distance measuring device in accordance with one aspect of the invention includes:

emitting light with the light emission portion;

receiving measurement light that is emitted by the light emission portion and reflected by the measurement object by the light receiving portion, the light receiving portion comprising a plurality of pixels, each pixel having at least one light receiving portion and being configured to output a light reception signal that depends on the measurement light incident on the pixel;

discriminating, in particular for each pixel individually, whether the pixel receives measurement light;

selectively outputting (forwarding) the light reception signal of each pixel individually, depending on a determination result of the step of determining for each pixel individually whether the pixel receives measurement light; and outputting a distance signal that is indicative of a distance between the measuring device and the measurement object based on the received light reception signals.

The evaluation portion may be configured to detect a plurality of light reception signals from a plurality of objects, to determine a shape according to which the objects are arranged, and/or to determine distances to the respective objects.

Further possible implementations or alternative solutions of the invention also encompass combinations—that are not explicitly mentioned herein—of features described above or below with regard to the embodiments. The person skilled in the art may also add individual or isolated aspects and features to the most basic form of the invention.

Further embodiments, features and advantages of the present invention will become apparent from the subsequent description and dependent claims, taken in conjunction with the accompanying drawings, in which:

EMBODIMENTS OF THE INVENTION

Figure 1:
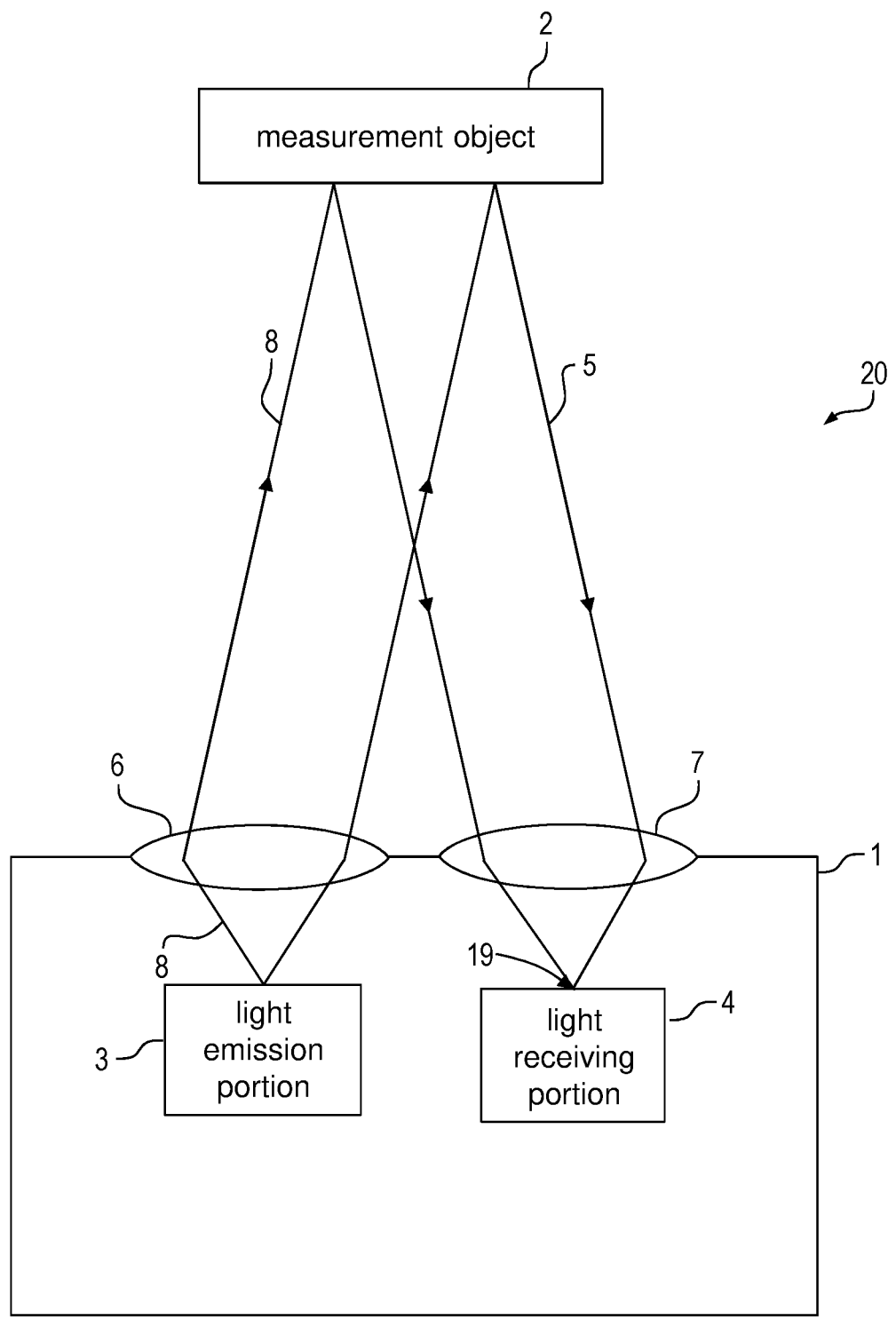
FIG. 1 shows an example of an optical system with a distance measuring device according to a first embodiment.

In the figures, like reference numerals designate like or functionally equivalent elements, unless otherwise indicated.

FIG. 1 shows an example of an optical system 20 including a distance measuring device 1 according to a first embodiment and a measurement object 2. The distance measuring device 1 of this embodiment is configured as a photoelectric sensor and is a distance determination device for determining the distance to the measurement object 2, which is also called "object 2" in the following. The distance measuring device 1 comprises a light emission portion 3, a light receiving portion 4, a collimator 6 and a converging lens 7.

The light emission portion 3 is a laser source emitting pulsed light at a predetermined frequency and at a predetermined intensity. Alternatively, the pulses may be emitted in a non-periodic manner and/or the pulses may not have constant amplitudes. For example, the amplitudes and frequencies of the pulses can be self-determined based on a signal-to-noise ratio.

The light emitted by the light emission portion 3 passes the collimator 6 when exiting the distance measuring device 1. The collimator 6 forms the light emitted by the light emission portion 3 into a substantially parallel light beam, referred to as emitted light 8 below.

When the emitted light 8 reaches the measurement object 2, it is reflected back towards the distance measuring device 1 by the measurement object 2. The emitted light that is reflected by the measurement object 2 forms measurement light 5. In other words, the measurement light 5 is obtained by reflection of the emitted light 8 at the measurement object 2. The measurement light 5 is converged onto a spot 19 of the light receiving portion 4 by the converging lens 7 located at the entrance of the distance measuring device 1. The spot 19 is the surface of the light receiving portion 4 that receives the incident measurement light 5. Although the spot 19 is shown to be circular, it should be clear to the skilled person that it may also have a different shape, for example elliptical.

Figure 2:
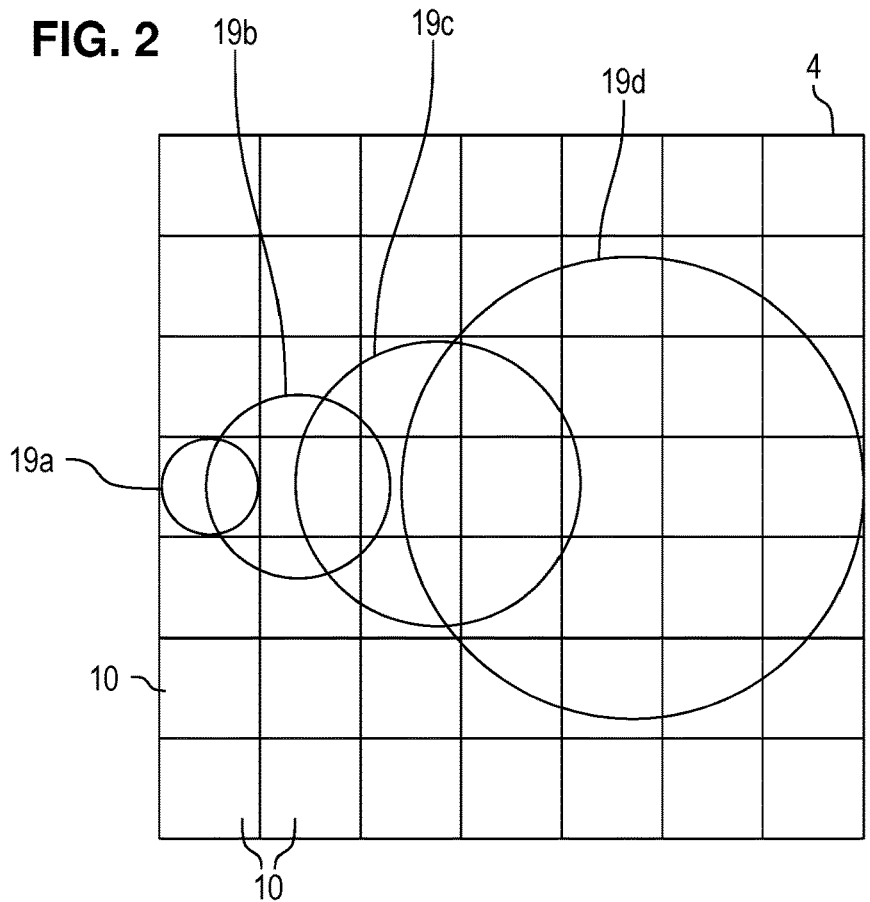
FIG. 2 shows an example of a light receiving portion.

Depending on how far the object 2 is from the distance measuring device 1, the size of the spot 19 may vary. This is illustrated in FIG. 2, which shows an example of a light receiving portion 4. As shown in FIG. 2, the light receiving portion 4 forms a detection region with a plurality of pixels 10 arranged in an array. The array has seven columns and seven rows, as an example. The light receiving portion 4 can be used to detect incident light, in particular incident measurement light 5. In the present example, each pixel 10 has a square light receiving surface 9. It should be noted that, for illustrative reasons, the pixels 10 are shown to be contiguous to each other in FIG. 2, but they will ordinarily be not contiguous to each other, but spaced slightly apart, so that signal lines or the like may be arranged between adjacent pixels. Further, in FIG. 2, the pixels 10 are arranged in a pattern with several rows and columns. However, they could also be arranged in a different geometry, for example in a circle, in radial arrangements, in asymmetric arrangements and the like. The same is also true for the drawings discussed below.

FIG. 2 shows four light spots 19a-19d as examples for the light spot 19 shown in FIG. 1. The substantially round light spots 19a-19d differ from one another with regard to their diameters. Depending on the diameter of the light spot 19a-19d, a different number of pixels 10 are illuminated by the measurement light 5. The diameter of each light spot 19a-19d varies, e.g. depending on how far the object 2 from which the measurement light 5 was received is located. The smaller the diameter of the light spot 19a-19d, the further away (or the closer, depending on the optical system) the object 2 is located from the distance measuring device 1. In the example of FIG. 2, the light spot 19d is hence obtained from an object 2 that is closer than an object 2 that creates the light spot 19c and so on. As shown in FIG. 2, there may also be a shift in the center of the light spots 19a-19d depending on the distance of the object 2 due to the parallax effect.

The distance to the object 2 can be determined by analyzing a time of flight of the measurement light 5. The time of flight of the measurement light 5 corresponds to the time it takes for the measurement light 5 to travel from the distance measuring device 1 to the object 2 and back to the distance measuring device 1. By measuring a difference in time between the time at which a certain light pulse was emitted by the light emitting portion 3 and the time at which this light pulse is received by the light receiving portion 4, the time of flight of the measurement light 5 can be detected. These time of flight measurements will be described in greater detail with reference to FIGS. 7A-7E below.

In addition to receiving the measurement light 5 that is emitted by the light emission portion 3 and reflected back by the object 2, the light receiving portion 4 may also receive ambient (stray) light. Such ambient light may be caused by other light sources or may be the result of multiple reflections (echoes) of the emitted light beam at other reflection surfaces. The reception of such ambient light falsifies the determination of the distance to the object 2 performed by the distance measuring device 1 and is therefore undesirable. The distance measuring device 1 is capable of discriminating between pixels that receive measurement light 5 and pixels that do not receive measurement light 5 but only the ambient light, as will be described below.

Figure 3:
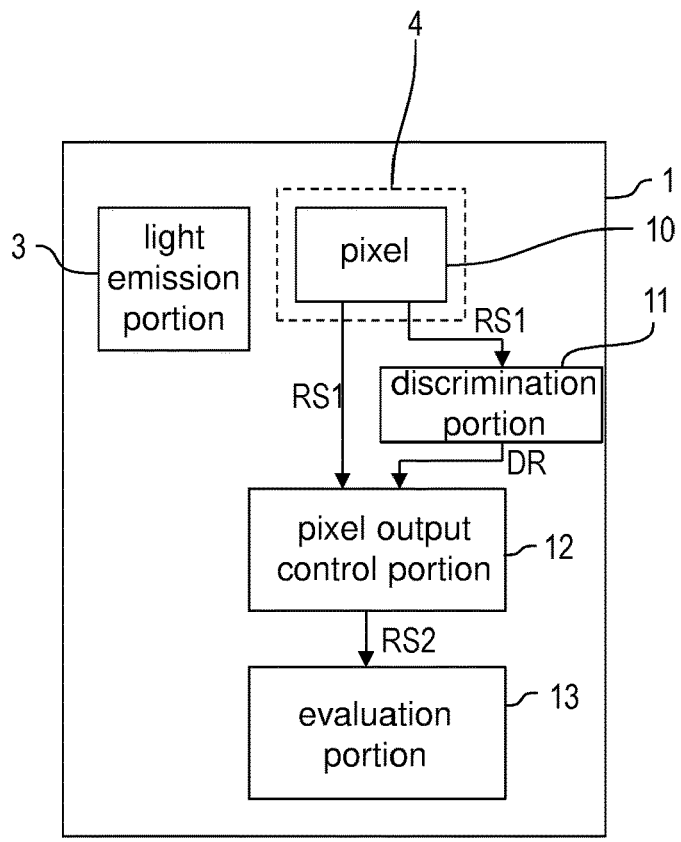
FIG. 3 shows the distance measuring device according to the first embodiment.

FIG. 3 shows a view of a part of the distance measuring device 1. In particular, FIG. 3 shows one pixel 10 of the light receiving portion 4, which is connected to a discrimination portion 11, a pixel output control portion 12 and an evaluation portion 13. The discrimination portion 11 successively receives light reception signals RS1 from the pixel 10 and determines whether the pixel 10 receives measurement light 5 based on the light reception signals RS1. In accordance with the light reception signal RS1, the discrimination portion 11 outputs a discrimination signal DR (discrimination result) indicating whether the light received by the pixel 10 includes measurement light 5 or only comprises ambient light. The discrimination signal DR may be a binary signal varying between a low and a high level. For example, the high level may indicate that the light received by the pixel 10 includes measurement light 5 and the low level may indicate that the light received by the pixel does not include measurement light 5 but includes only ambient light.

This discrimination signal DR is sent to the pixel output control portion 12, which enables or disables the output of the pixel 10 depending on the received discrimination signal DR. That is, if the discrimination signal DR indicates that the pixel 10 receives measurement light 5, the pixel output control portion 12 enables the output of the pixel 10 and forwards the light reception signal RS1 as a light reception signal RS2 to the evaluation portion 13. In other words, if the pixel 10 receives measurement light 5, the pixel output control portion sends the light reception signal RS2 to the evaluation portion, with the light reception signal RS2 corresponding to the light reception signal RS1 from the pixel 10.

By contrast, if the discrimination signal DR indicates that the pixel 10 only receives ambient light, the pixel output control portion 12 disables the output of the pixel 10 and forwards a light reception signal RS2 which is not equal to the light reception signal RS1 to the evaluation portion 13. In this case, the light reception signal RS2 may be, for example, a constant low-level signal.

Thus, the light reception signal RS2 transferred from the pixel output control portion 12 to the evaluation portion 13 corresponds to the light reception signal RS1 from the pixel 10 if the pixel 10 receives measurement light 5. On the other hand, the light reception signal RS2 is a constant low-level or the like if the pixel 10 does not receive any measurement light 5, as indicated by the discrimination result DR.

In order to enable and disable the output of the pixel 10, the pixel output control portion 12 may be implemented as a switch. For example, it may be a transistor, such as a FET (field effect transistor), where the discrimination signal DR is applied to the gate of the FET. The pixel output control portion 12 may also comprise one or more logic gates. It should be noted that the pixel output control portion 12 is located between the pixel 10 and the evaluation portion 13. Also, in the present example, the pixel output control portion 12 is connected directly to the pixel 10. In other words, no further circuit elements are provided between the pixel 10 and the pixel output control portion 12.

The evaluation portion 13 generates a signal that contains information about the time of flight of a light beam emitted by the distance measuring device 1 and received by the pixel 10 associated with that evaluation portion 13.

In the present embodiment, the light reception signal RS is evaluated by the evaluation portion 13 only when the pixel 10 receives measurement light 5. If it only receives ambient light, the light reception signal RS is discarded and not considered for evaluating the distance to the object 2.

Figure 4:
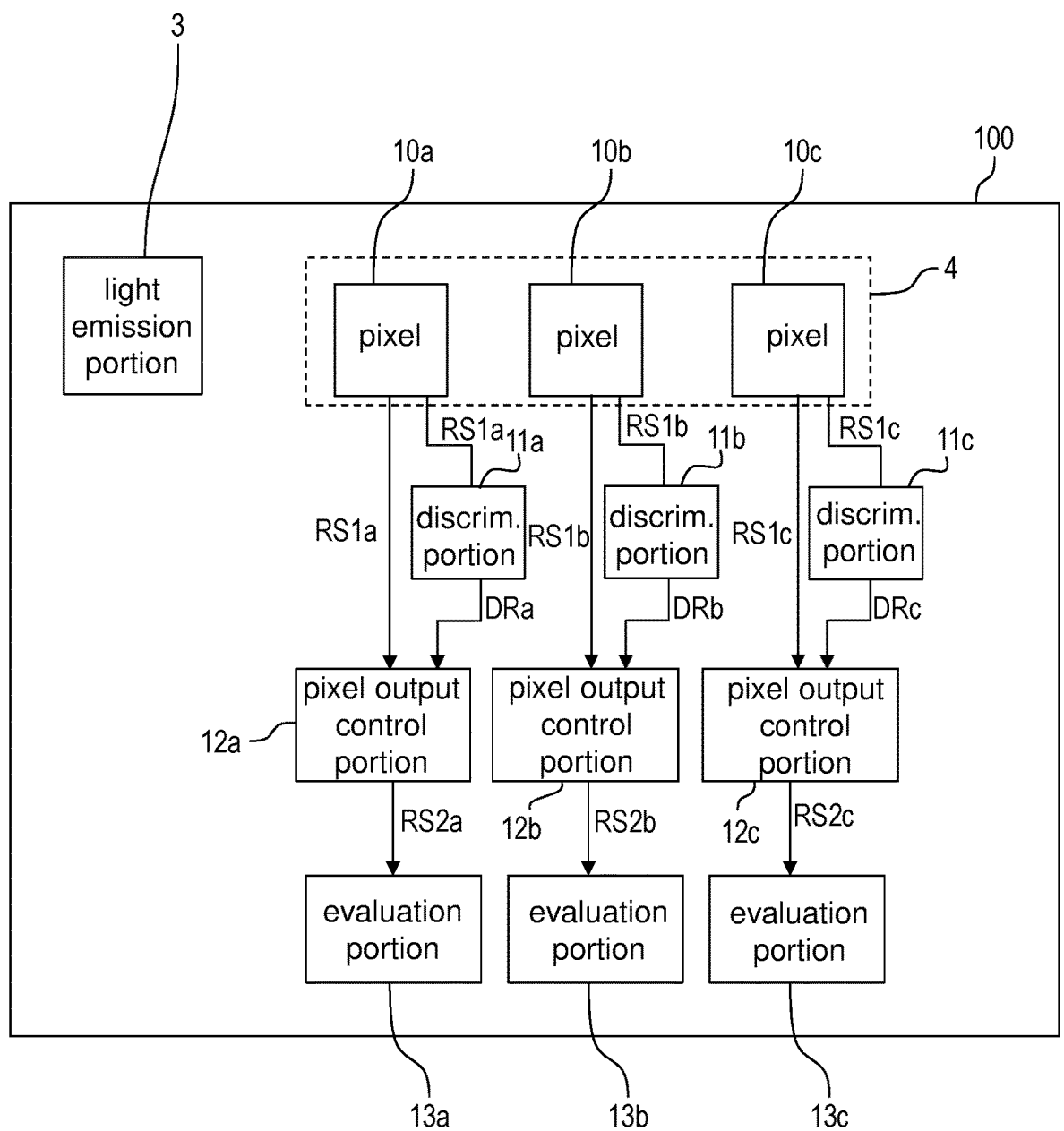
FIG. 4 shows a of a distance measuring device according to a second embodiment.

Discrimination portions 11 and pixel output control portions 12 having the functionality described above may be provided for each of the pixels 10 of the light receiving portion 4. In other words, there may be a one-to-one-to-one relationship between the pixels 10, the discrimination portions 11 and the pixel output control portions 12. FIG. 4 shows a distance measuring device 100 with such a configuration. In this distance measuring device 100, a discrimination portion 11a-11c and a pixel output control portion 12a-12c is associated with each of the pixels 10a-10c of the light receiving portion 4. Although FIG. 4 shows only three pixels 10a-10c with corresponding discrimination portions 11a-11c and pixel output control portions 12a-12c, it should be understood that the light receiving portion 4 can comprise more pixels 10a-10c also each having their own discrimination portion 11a-11c and pixel output control portion 12a-12c. In one preferable embodiment, the distance measuring device 100 comprises 400 pixels arranged in an array of 50 rows of 8 pixels or 10 rows of 40 pixels each.

The functions of the discrimination portions 11a-11c and pixel output control portions 12a-12c associated with each pixel are similar to the functions of the discrimination portion 11 and pixel output control portion 12 described in view of FIG. 3 and will hence be explained only briefly in the following. The discrimination portions 11a-11c can also be regarded collectively constituting a single discrimination portion 11. The pixel output control portions 12a-12c can also be regarded as collectively constituting a single pixel output control portion 12.

The discrimination portion 11a determines, based on a signal RS1a received by the pixel 10a, if the pixel 10a receives measurement light 5 or not, and accordingly sends a discrimination signal DRa to the pixel output control portion 12a. The pixel output control portion 12a enables or disables the output of the pixel 10a depending on the discrimination signal DRa, i.e. depending on whether the pixel 10a receives measurement light 5 or only ambient light. The light reception signal RS1a is only forwarded to an evaluation portion 13a as the light reception signal RS2a when the output of the pixel 10a is activated by the pixel output control portion 12a. Otherwise, if the pixel 10a does not receive the measurement light 5, the light reception signal RS1a is not transmitted to the evaluation portion 13a.

Similarly, the discrimination portion 11b determines, based on a signal RS1b received by the pixel 10b, if the pixel 10b receives measurement light 5 or not, and accordingly sends a discrimination signal DRb to the pixel output control portion 12b. The pixel output control portion 12b enables or disables the output of the pixel 10b depending on the discrimination signal DRb, i.e. depending on whether the pixel 10b receives measurement light 5 or only ambient light. The light reception signal RS1b is only forwarded to the evaluation portion 13b as the light reception signal RS2b when the output of the pixel 10b is activated by the pixel output control portion 12b. Otherwise, if the pixel 10b does not receive the measurement light 5, the light reception signal RS1b is not transmitted to the evaluation portion 13b.

Similarly, the discrimination portion 11c determines, based on a signal RS1c received by the pixel 10c, if the pixel 10c receives measurement light 5 or not, and accordingly sends a discrimination signal DRc to the pixel output control portion 12c. The pixel output control portion 12c enables or disables the output of the pixel 10c depending on the discrimination signal DRc, i.e. depending on whether the pixel 10c receives measurement light 5 or only ambient light. The light reception signal RS1c is only forwarded to the evaluation portion 13c as the light reception signal RS2c when the output of the pixel 10c is activated by the pixel output control portion 12c. Otherwise, if the pixel 10c does not receive the measurement light 5, the light reception signal RS1c is not transmitted to the evaluation portion 13c.

Based on the light reception signals RS2a, RS2b, RS2c, the evaluation portion 13a, 13b and 13c respectively output a distance signal that is indicative of the distance to the object 2. For example, the evaluation portion 13a, 13b, 13c may calculate an average value of the time of flight values determined from the light reception signals RS2a, RS2b, RS2c. Alternatively, the evaluation portions 13a, 13b, 13c may determine the distance to the object 2 using histograms, as explained further below. The evaluation portions 13a, 13b, 13c may be hard-wired on the same semiconductor chip as the pixels 10, but it is also possible to realize the functionality of the evaluation portions 13a, 13b, 13c with a CPU that performs the necessary calculations.

The result of the evaluation, i.e. the distance to the object 2, may be output on a display (not shown) with which the distance measuring device 100 is provided. Alternatively, it is also possible that the distance to the object 2 is output to another processing portion, such as a controller, a CPU, a computer, another electronic circuit or the like, or used to control another process.

The distance to the object 2 is determined based only on the signals from the pixels 10a-10c that receive measurement light 5. The signals from pixels 10a-10c on which only ambient light is incident are not taken into account when determining the distance to the object 2. The distance to the object 2 is thus determined with a higher accuracy.

In the distance measuring device 100 according to this embodiment, each pixel 10a-10c has its own evaluation portion 13a, 13b, 13c associated thereto. The distance measuring device 100 does not comprise any combiners or multiplexers, thereby simplifying the structure of the distance measuring device 100. In alternative embodiments, the signals from the respective pixels 10a-10c which are forwarded by the respective pixel output control portions 12a-12c may also be combined using a combiner or a multiplexer (not shown). The use of a combiner or a multiplexer can be advantageous because light reception signals RS1 from several pixels 10 can be forwarded to a single discrimination portion 11 via the combiner or multiplexer. A size of the distance measuring device 100 can thereby be reduced.

Figure 5:
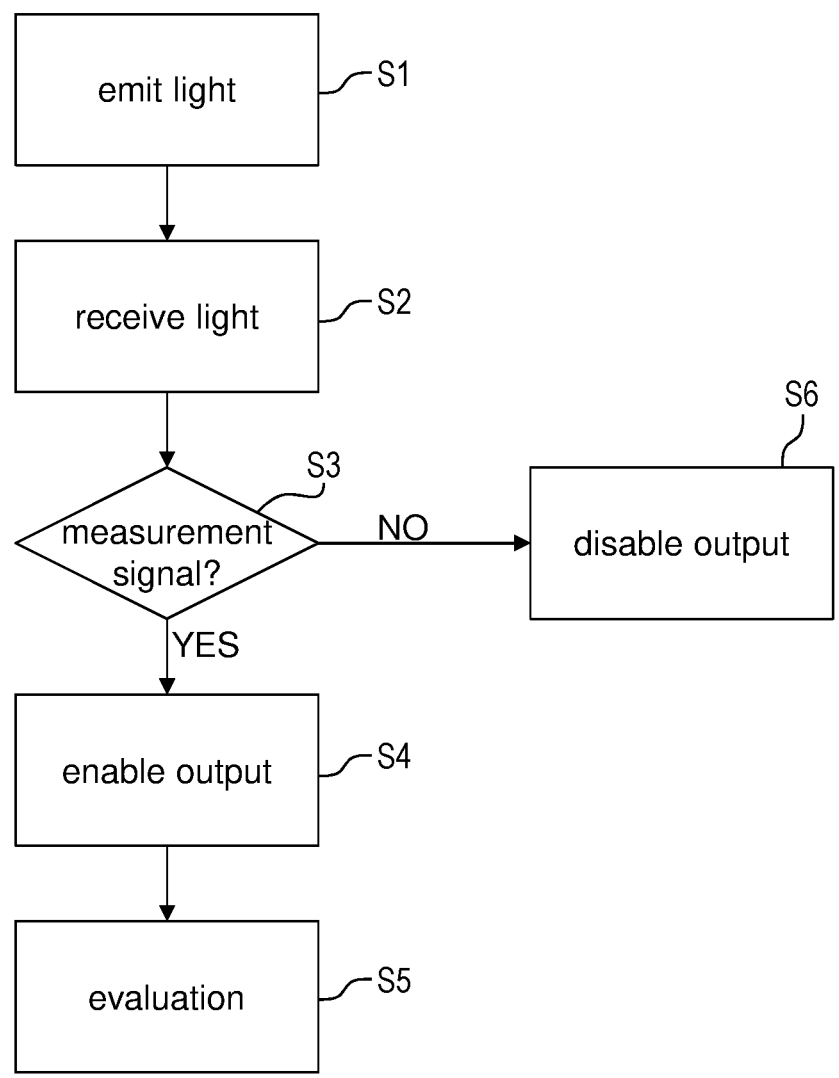
FIG. 5 is a flowchart illustrating a measurement method for determining a distance to a measurement object according to a first embodiment.

FIG. 5 is a flowchart illustrating a measurement method for determining a distance to a measurement object 2 using the distance measuring device 1 or 100.

In a step S1, the distance measuring device 1, 100 emits light 8 using the light emission portion 3. In a step S2, measurement light 5 reflected from the object 2 is received by the light receiving portion 4 of the distance measuring device 1, 100.

In a step S3, the discrimination portion 11, 11a-11c determines for each pixel 10, 10a-10c whether the received light is measurement light 5 and accordingly generates a discrimination signal DR, DRa-DRc. If it is determined in step S3 that the light received by a pixel 10, 10a-10c is measurement light 5, the pixel output control portion 12 enables the output of the light reception signals RS1 of the pixel 10, 10a-10c as the light reception signal RS2 and forwards the output to the evaluation portion 13 in step S4. Then, in a step S5, the evaluation portion 13, 13a-13c determines the distance to the object 2 based on the light reception signals RS2.

Alternatively, if it is determined in step S3 that the light received by a pixel 10, 10a-10c is not measurement light 5 (i.e. when it is ambient light or noise), the pixel output control portion 12 disables the output of the pixel 10, 10a-10c and does not forward the light reception signal RS1 as the light reception signal RS2 in step S6. It should be noted that "enabling the output" and "disabling the output" may correspond to turning a switch of the pixel output control portion 12 on or off, respectively.

Figure 6:
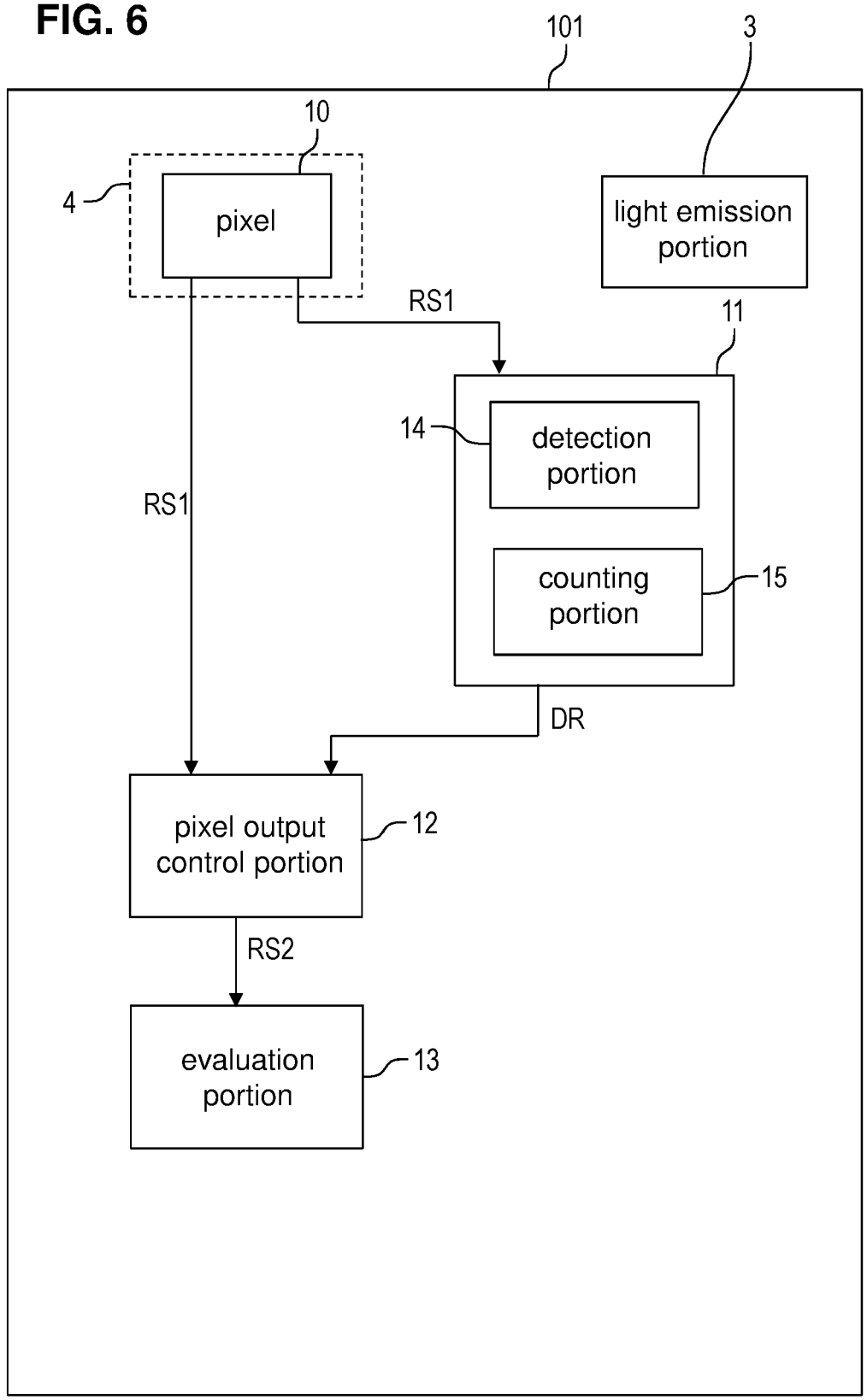
FIG. 6 shows a distance measuring device according to a third embodiment.

FIG. 6 shows a distance measuring device 101 according to a second embodiment. In the distance measuring device 101 of this embodiment, the discrimination portion 11 includes a detection portion 14 and a counting portion 15. The detection portion 14 and the counting portion 15 contribute to determining whether the light received by the associated pixel 10 is measurement light 5 or ambient light. The functions of the detection portion 14 and the counting portion 15 will be explained in greater detail below in view of FIGS. 7A-7E and 8.

Figure 7A:
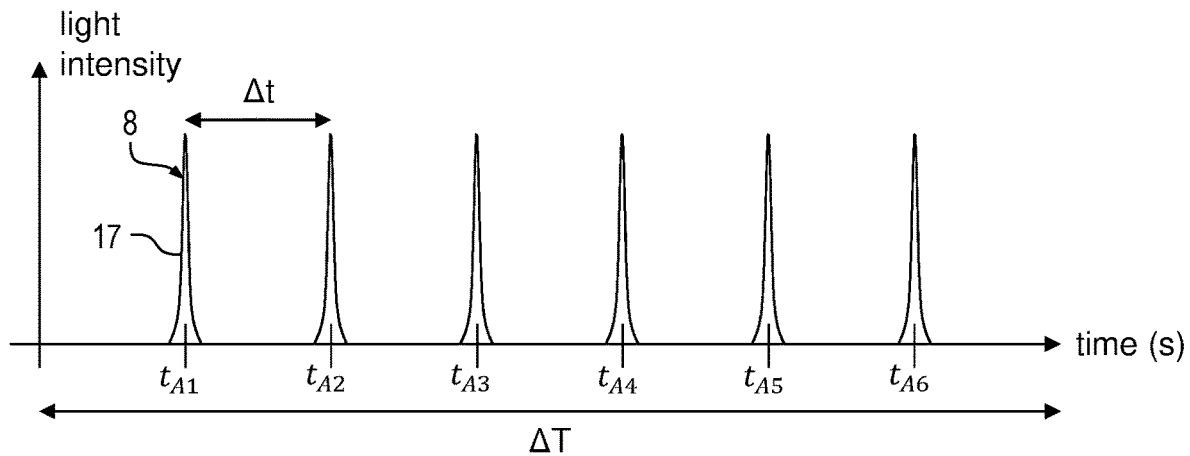
FIG. 7A shows an example of an emitted light intensity over time.

FIG. 7A shows an example of the intensity of the light emitted by the light emission portion 3 over time. As shown in FIG. 7A, the light emission portion 3 emits light 8 at regular intervals towards the object 2. That is, a light pulse 17 of light is emitted at times $t_{A1}$, $t_{A2}$, $t_{A3}$, $t_{A4}$, $t_{A5}$ and $t_{A6}$, which are spaced from one another by a time interval $\Delta t$, during a predetermined time period $\Delta T$. The time interval $\Delta t$ may be fixed, but there is no limitation thereto.

Figure 7B:
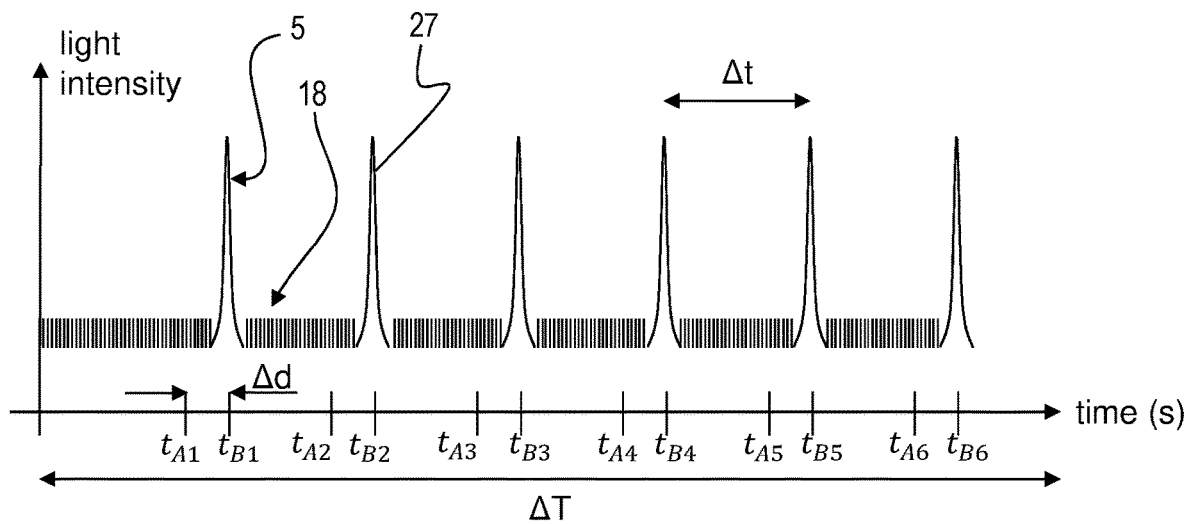
FIG. 7B shows an example of a received light intensity over time.

FIG. 7B shows the light intensity of the light received by a pixel 10 of the light receiving portion 4 that receives measurement light 5 as a function of time. The light received by the pixel 10 has two components: an ambient light component 18 that basically corresponds to a background noise and measurement light 5 superimposed on the ambient light 18. The intensity of the measurement light 5 is much larger than that of the ambient light 18.

The ambient light 18 is a random distribution of photons that reach the pixel 10. The measurement light 5 is received as pulses 27 separated by the same fixed time interval $\Delta t$ that spaces the emitted pulses. The pulses 27 of measurement light 5 are received at times $t_{B1}$, $t_{B2}$, $t_{B3}$, $t_{B4}$, $t_{B5}$ and $t_{B6}$, which are respectively shifted by a time shift $\Delta d$ as compared to the times $t_{A1}$, $t_{A2}$, $t_{A3}$, $t_{A4}$, $t_{A5}$ and $t_{A6}$. The time shift $\Delta d$ results from the time it takes to the light 8 emitted by the light emission portion 3 to travel to the object 2 and back to the distance measuring device 101, plus any other time delays due to, for instance, the electronics, wiring or the like. The time shift $\Delta d$ varies as a function of the distance to the object 2 (time of flight) and can be evaluated to determine the distance to the object 2. In FIG. 7B, the time shift $\Delta d$ is not necessarily depicted in the same scale as the time interval $\Delta t$.

Figure 7C:
FIG. 7C shows another example of a received light intensity over time.

FIG. 7C shows the light intensity of the light received by a pixel 10 of the light receiving portion 4 that does not receive measurement light 5. The received light signal of such a pixel 10 only comprises ambient light 18 and noise, characterized by the random distribution of photons reaching the pixel 10.

Figures 7D, 7E:
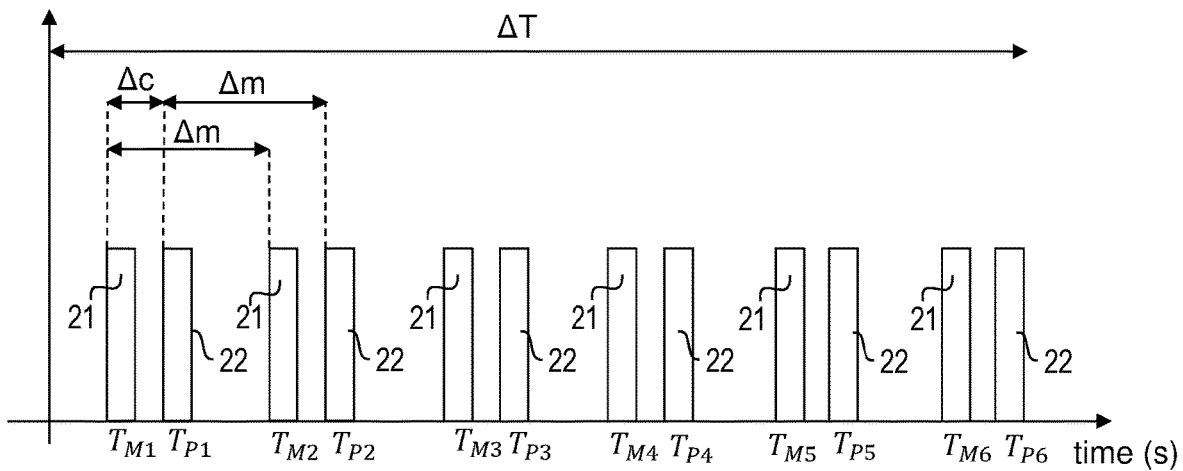
FIG. 7D shows an example of a signal detection process.
FIG. 7E shows a table indicating examples of results from the signal detection process.

FIG. 7D shows an example of a counting process performed using the counting portion 15. The detection portion 14 and the counting portion 15 contribute to determining whether the light received by the associated pixel 10 is measurement light 5 or ambient light 18. To this end, the detection portion 14 determines whether light is received at the corresponding pixel 10 during a plurality of first predetermined time intervals $T_{M1}$-$T_{M6}$ and a plurality of second predetermined time intervals $T_{P1}$-$T_{P6}$.

The first predetermined time intervals $T_{M1}$-$T_{M6}$ are set such that they include the times $t_{B1}$, $t_{B2}$ . . . , at which the pulsed measurement light 5 is incident on the distance measuring device 101 and the second predetermined time intervals $T_{P1}$-$T_{P6}$ are set such that they do not include these times $t_{B1}$, $t_{B2}$ . . . . For example, the first predetermined time intervals $T_{M1}$-$T_{M6}$ may be set to start at the time when the pulsed light 8 is emitted by the distance measuring device 101 and to stop at a time that is sufficiently long such that the measurement light 5 reflected from the object 2 is included in the time interval. The length of the first predetermined time intervals $T_{M1}$-$T_{M6}$ is equal to the length of the second predetermined time intervals $T_{P1}$-$T_{P6}$ and may be several nanoseconds, for example 5 to 500 nanoseconds, depending on the range of the distance measuring device 101. Furthermore, this length may be variable. For example, it is possible that the length of this period can be adjusted manually by the user, or that it is adjusted automatically depending on the brightness of the ambient light or the desired distance range to measure. Thus, it is possible to adjust the sensing conditions to the ambient light conditions, thereby improving the accuracy even further.

In this example, each pixel 10 is constituted by one single photon detector, for example a single photon avalanche diode (SPAR), which allows the detection of single photons incident on the pixel 10. That is, every time a photon is incident on a pixel 10, the pixel generates a SPAD current that is detected by the detection portion 14.

Photons are incident on the pixel 10 in discrete events that are subject to a certain statistical distribution. Accordingly, during a given time interval T, there may be zero, one or a plurality of photons incident on the pixel 10. The detection portion 14 is configured such that it determines that the pixel 10 has received light during a given time interval T if a minimum number n of photons are incident on the pixel 10 during that interval T. This minimum number n may be 1, for example, but it may also be a greater number.

FIG. 7E shows a table indicating the detection results of the detection portion 14. That is, the table shows for each of the first and second predetermined time intervals $T_{M1}$-$T_{M6}$ and $T_{P1}$-$T_{P6}$ whether light is received or not, i.e. whether the minimum number n of photons has been received. In FIG. 7E, "+1" indicates the first predetermined time intervals $T_{M1}$-$T_{M6}$ at which light is received at the pixel 10, "−1" indicates the second predetermined time intervals $T_{P1}$-$T_{P6}$ at which light is received at the pixel 10 and "0" indicates that no signal is received at the pixel 10.

Assigning the number "+1" to first predetermined time intervals $T_{M1}$-$T_{M6}$ during which a signal is received at the pixel 10 corresponds to assigning a first weight (namely "+1") to said first predetermined time intervals $T_{M1}$-$T_{M6}$. Assigning the number "−1" to second predetermined time intervals $T_{P1}$-$T_{P6}$ during which a signal is received at the pixel 10 corresponds to assigning a second weight (namely "−1") to said second predetermined time intervals $T_{P1}$-$T_{P6}$. This weighting can be performed by a weighting portion (not shown). If no photon is received by the pixel 10 during the interval T, then it is assigned a weight of "0".

In FIG. 7E, the first row ("inside spot") comprises an example of results from the detection portion 14 when the corresponding pixel 10 is inside the light spot 19 and irradiated by light comprising measurement light 5 (as shown in FIG. 7B), while the second row ("outside spot") comprises an example of results from the detection portion 14 when the corresponding pixel 10 is outside the light spot 19 and is irradiated by light that only comprises ambient light 18 (as shown in FIG. 7C).

A pixel 10 receiving only ambient light 18 is irradiated randomly by photons. Thus, when the detection portion 14 measures the presence of light at the first and second predetermined time intervals $T_{M1}$-$T_{M6}$ and $T_{P1}$-$T_{P6}$ and over a long enough time interval $\Delta T$, statistically, the number of times that the detection portion 14 detects light at the first predetermined time intervals $T_{M1}$-$T_{M6}$ should be more or less equal to the number of times that it detects light at the second predetermined time intervals $T_{P1}$-$T_{P6}$.

By contrast, a pixel 10 receiving measurement light 5 reliably receives the measurement signal 5 so that overall, the number of times that the discrimination portion 11 detects light at the first predetermined time intervals $T_{M1}$-$T_{M6}$ is greater than the number of times that it detects light at the second predetermined time intervals $T_{P1}$-$T_{P6}$. It should be noted that since the incidence of light as photons on the pixels 10 is a stochastic process, light may not necessarily be detected during all time intervals $T_{M1}$-$T_{M6}$, even if the pixels 10 are within the spot 19 and thus subject to measurement light 5. An example of this is given for the period $T_{M3}$, during which no light is detected inside the spot of measurement light 5. However, generally speaking, the probability that light is detected inside the spot of measurement light 5 during the time intervals $T_{M1}$-$T_{M6}$ is much greater than during the time intervals $T_{P1}$-$T_{P6}$ The counting portion 15 counts the number of times that the detection portion 14 detects a signal at the first predetermined time intervals $T_{M1}$-$T_{M6}$ and the number of times that the detection portion 14 detects a signal at the second predetermined time interval $T_{P1}$-$T_{P6}$ and compares these. When the result of this comparison is equal to or greater than a predetermined comparison threshold, for example greater than or equal to +2, the detection portion 14 determines that the signal received by the pixel 10 comprises measurement light 5. Otherwise, if the result of the comparison is smaller than the predetermined comparison threshold, the detection portion 14 determines that the signal received by the pixel 10 comprises only ambient light 18. The pixel output control portion 12 accordingly enables or disables the output of the pixel 10, as described above. This calculation corresponds to summing up (integrating) the weighted counts in each row of the table of FIG. 7E. For example, for the row marked "inside spot", the sum is +2, which is equal to the comparison threshold, so that the discrimination portion 11 regards the pixel 10 as being inside the spot and sends a corresponding discrimination result signal DR to the pixel output control portion 12.

An advantage of the present embodiment is that the discrimination between pixels 10 that receive measurement light 5 and pixels 10 that do not receive measurement light can be continued during the actual measurement. That is to say, the discrimination portion 11 can be configured to constantly monitor the pixel 10, so that only the signals from those pixel that actually receive measurement light 5 are taken into account for the calculation of the measurement result. In the present embodiment, the reception of six light pulses is monitored, but needless to say, the number of light pulses whose reception is monitored may also be larger or smaller than that. In one possible embodiment, the above-described discrimination is performed always on the basis of the last m (e.g. 6) light pulses emitted during a predetermined time period ΔT (e.g. 1 microsecond). Such a dynamic forwarding of the output of the pixels 10 is advantageous over an arrangement in which it is first determined which pixels are inside the spot, and then the pixels that are outside the spot are turned off, e.g. by interrupting the voltage supply to those pixels.

Figure 8:
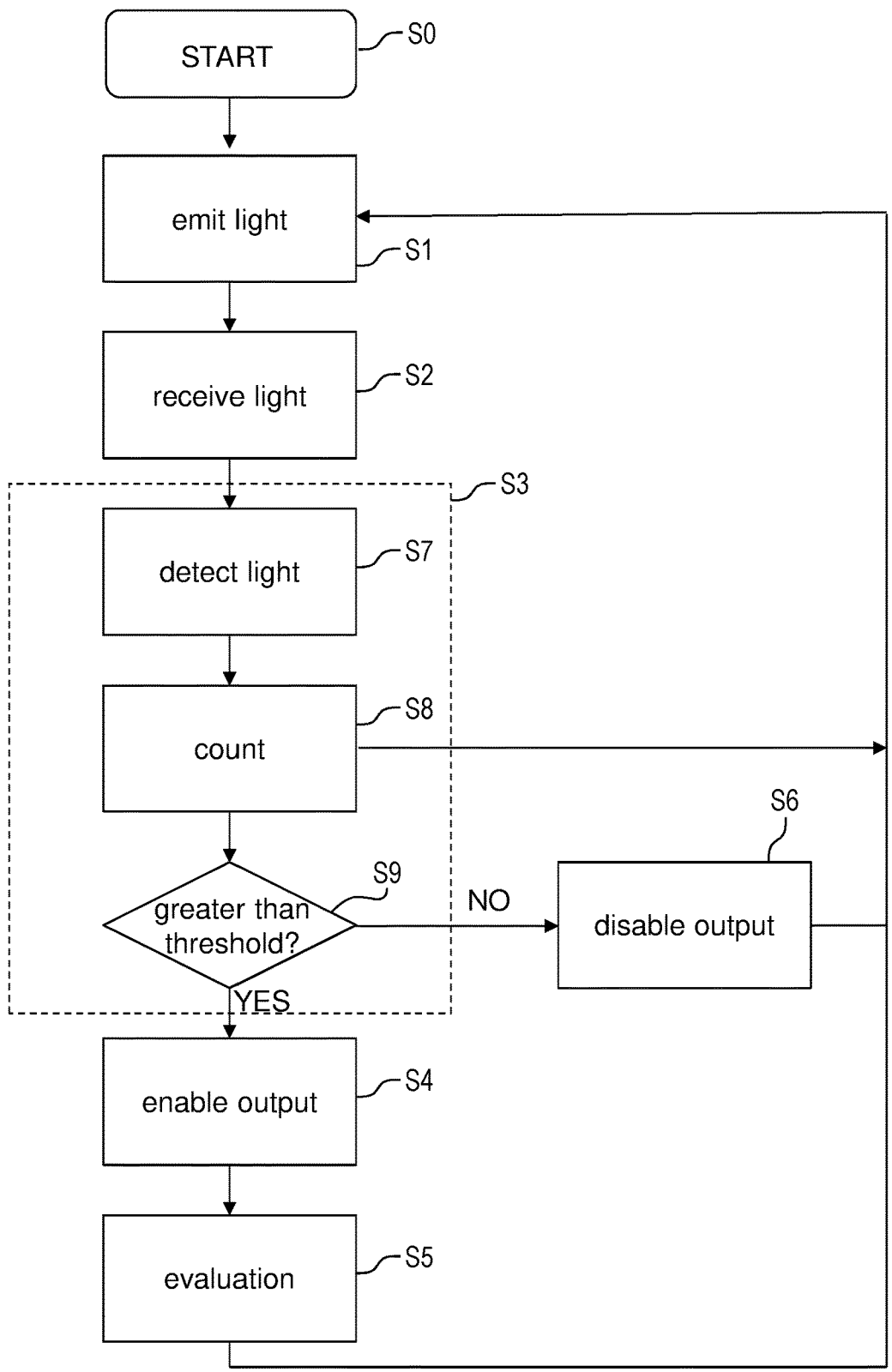
FIG. 8 is a flowchart illustrating a measurement method for determining a distance to a measurement object according to a second embodiment.

FIG. 8 is a flowchart illustrating a measurement method for determining a distance to a measurement object according to a second embodiment. The method of FIG. 8 can be implemented by the distance measuring device 101 according to the third embodiment.

In the following, only the differences between the method according to the first embodiment (FIG. 5) and the second embodiment will be described. In the second embodiment, step S3 comprises the steps S7, S8 and S9. In step S7, the detection portion 11 detects the signals at the pixel 10 at the first and second predetermined time intervals $T_{M1}$-$T_{M6}$ and $T_{P1}$-$T_{P6}$. In step S8, the counting portion 15 counts the number of times that the detection portion 14 detects a signal at the first predetermined time intervals $T_{M1}$-$T_{M6}$ and the number of times that the detection portion 14 detects a signal at the second predetermined time intervals $T_{P1}$-$T_{P6}$ during the time ΔT.

In step S9, the number of times that the detection portion 14 detects a signal at the first predetermined time intervals $T_{M1}$-$T_{M6}$ and the number of times that the detection portion 14 detects a signal at the second predetermined time intervals $T_{P1}$-$T_{P6}$ during the time ΔT are compared and the result of this comparison is compared to the comparison threshold. If the comparison result is greater than or equal to the comparison threshold, the output of the pixel 10 is enabled in step S4. Otherwise, the output is disabled at step S6, and the steps S1, S2, S7, S8 and S9 are repeated for the entire time ΔT.

After the output of the pixel 10 has been evaluated by the evaluation portion 13 in step S5 or after the output of the pixel 10 has been disabled in step S6, the process returns to step S1.

Figure 9:
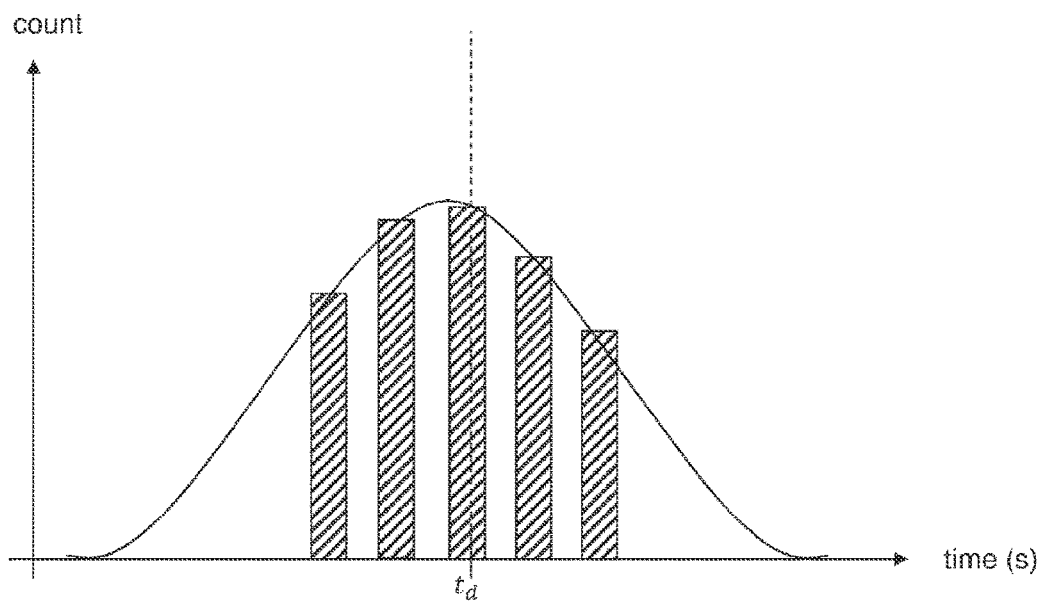
FIG. 9 shows an example of a histogram for determining a distance to the measurement object.

FIG. 9 shows a histogram generated at step S5 by the evaluation portion 13 and allowing to determine a travel time $t_d$ of the measurement light 5. The histogram is generated by counting the number of pixels for which a certain time of flight is measured and corresponds to a distribution of the determined times of flight. The mean value of the times of flight of the histogram is determined as the travel time $t_d$ and the distance to the object 2 is derived therefrom. It is also possible to estimate the distance without using a histogram, for example by using the averaging described above.

FIG. 10A to 10G show alternative layouts for the distance measuring device 1, 100, 101. The layout of FIG. 10A corresponds to the layout shown in FIG. 4, in which each pixel 10a-10c has its own discrimination portion 11a-11c, its own pixel output control portion 12a-12c and its own evaluation portion 13a-13c associated therewith.

Figure 10A:
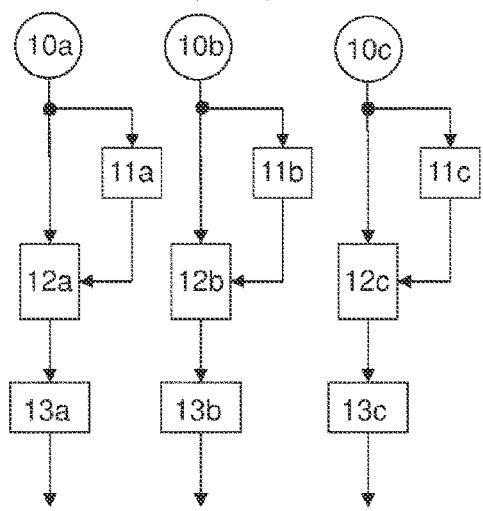
FIG. 10A-10G show examples of layouts of a distance measuring device according to further embodiments.
Figure 10B:
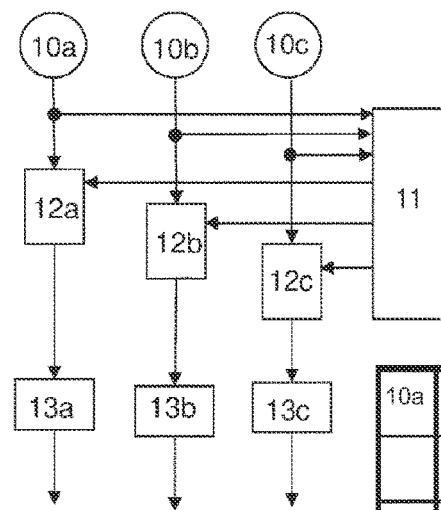
Figure 10B:
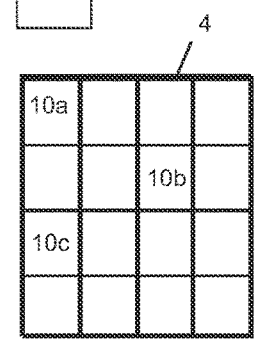

The layout in FIG. 10B differs from that in FIG. 10A in that the three pixels 10a-10c share a single discrimination portion 11. Using a single discrimination portion 11 can be advantageous in that less components are needed, leading to a less space-consuming and power-consuming distance measuring device 1, 100, 101. As illustrated in FIG. 10B, the pixels 10a-10c may be non-adjacent.

Figure 10C:
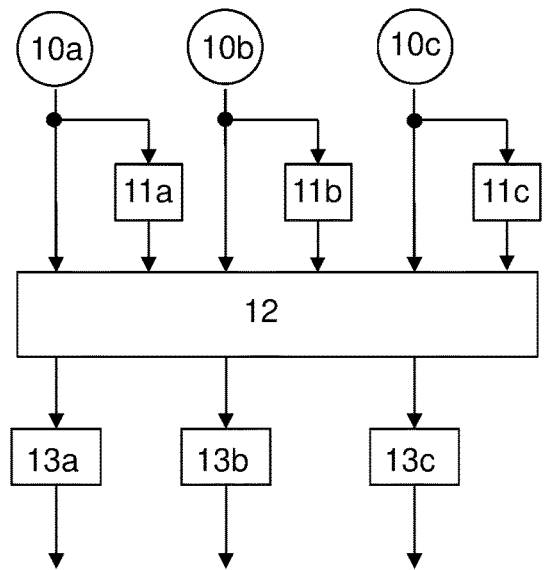

The layout in FIG. 10C differs from that in FIG. 10A in that the three pixels 10a-10c share a pixel output control portion 12. Using a single pixel output control portion 12 can be advantageous in that less components are needed, leading to a less space-consuming and power-consuming distance measuring device 1, 100, 101.

Figure 10D:
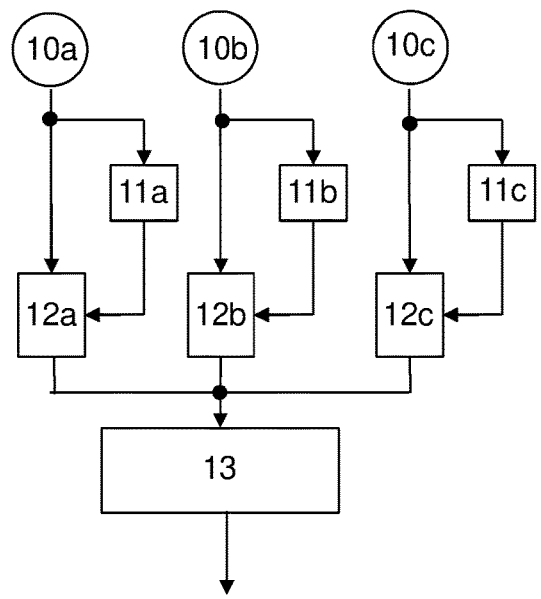

The layout in FIG. 10D differs from that in FIG. 10A in that the three pixels 10a-10c share a single evaluation portion 13. Using a single evaluation portion 13 can be advantageous in that less components are needed, leading to a less space-consuming and power-consuming distance measuring device 1, 100, 101.

Figure 10E:
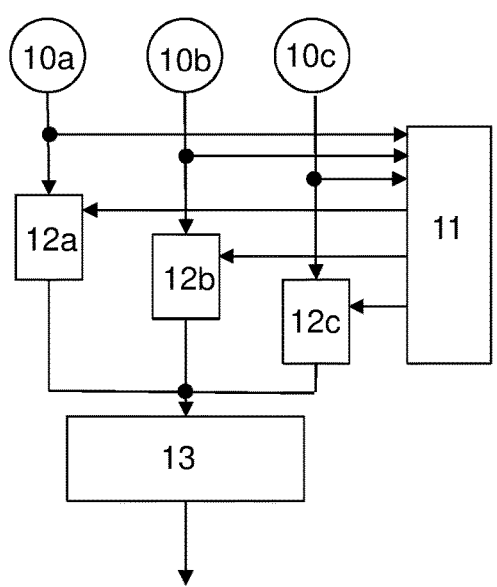

The layout in FIG. 10E corresponds to a mixture of the layouts of FIGS. 10B and 10D, in which each pixel 10a-10c is connected to own pixel output control portion 12a-12c, but only a single discrimination portion 11 and a single evaluation portion 13 are provided for a plurality of (or all) pixels 10a-10c.

Figure 10F:
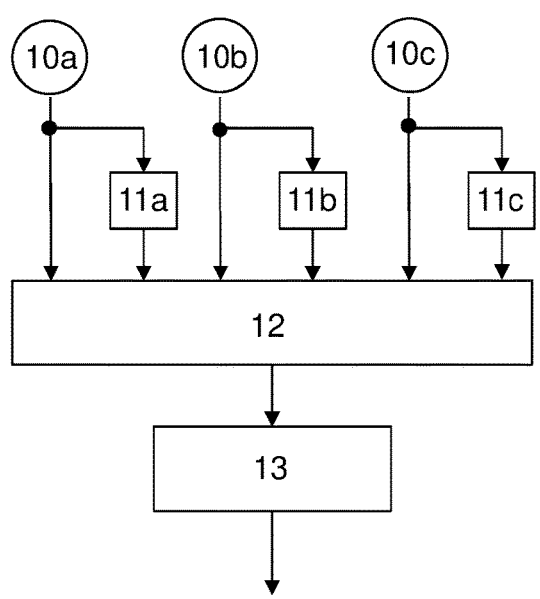

The layout in FIG. 10F corresponds to a mixture of the layouts of FIGS. 10C and 10D, in which each pixel 10a-10c has its own discrimination portion 11a-11c, but in which the pixels 10a-10c share a single pixel output control portion 12 and a single evaluation portion 13.

Figure 10G:
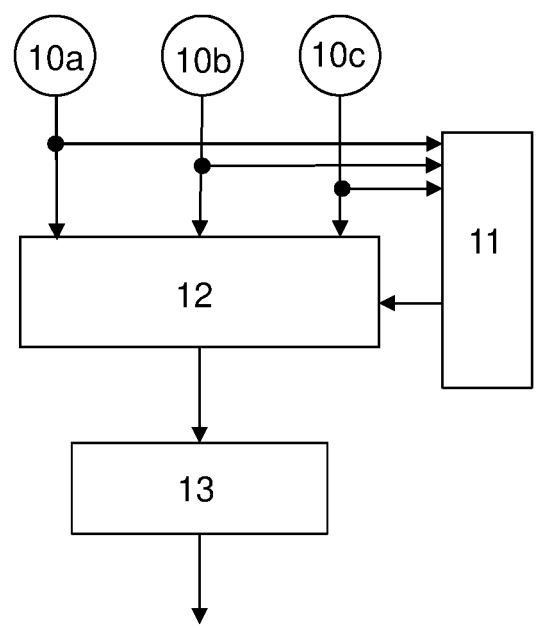

In the layout of FIG. 10G, the pixels 10a-10c share a single discrimination portion 11, a single pixel output control portion 12 and a single evaluation portion 13.

Although the present invention has been described in accordance with preferred embodiments, it is obvious for the person skilled in the art that modifications are possible in all embodiments. For example, the number of pixels 10 of the light receiving element 4 can be increased or reduced. Instead of determining a comparison result, the counting portion can integrate the received light signals over time, for example in case of analog photosensors, providing an electric signal proportional to the incoming detected light (e.g. APD, CCD, . . . ) and not just digital pulses as in case of SPADs and related sensing circuitry.

REFERENCE NUMERALS 1 distance measuring device
2 measurement object 3 light emission portion
4 light receiving portion
5 measurement light
6 collimator
7 (converging) lens
8 emitted light beam
9 light receiving surface
10 pixel
10a-10c pixel
11 discrimination portion
11a-11c discrimination portion
12 pixel output control portion
12a-12c pixel output control portion
13, 13' evaluation portion
14 detection portion
15 counting portion
17 light pulse
18 ambient light
19 light spot
19a-19d light spot
20 optical system
21, 22 rectangle
37 pulse
100 distance measuring device
101 distance measuring device
$t_{A1}$-$t_{A6}$ time
$t_{B1}$-$t_{B6}$ time
$T_{M1}$-$T_{M6}$ first predetermined time interval
$T_{P1}$-$T_{P6}$ second predetermined time interval
Δc counter time period
Δd time shift
Δt time period
DR discrimination signal
DRa-DRc discrimination signal
RS1, RS2 light reception signal
RS1a-RS1c light reception signal
RS2a-RS2c light reception signal
S1-S9 method steps

The invention claimed is:

1. A distance measuring device comprising:
a light emission portion configured to emit light;
a light receiving portion configured to receive measurement light that is emitted by the light emission portion and reflected by a measurement object, the light receiving portion comprising a plurality of pixels, each pixel having at least one light receiving portion and being configured to output a light reception signal that depends on the measurement light incident on the pixel;
a discrimination portion configured to receive the light reception signal from the light receiving portion and discriminate whether the pixel receives the measurement light or only ambient light, and to output a discrimination result indicating whether the light received by the pixel includes the measurement light or only the ambient light;
a pixel output control portion configured to receive the discrimination result output from the discrimination portion and selectively enable output of the light reception signal of each pixel individually or disable output of the light reception signal of each pixel individually, depending on the discrimination result of the discrimination portion; and
an evaluation portion configured to receive the light reception signals output by the pixel output control portion and to output a distance signal that is indicative of a distance between the measuring device and the measurement object, based on these light reception signals, wherein
the discrimination portion comprises:
a detection portion for detecting whether light is received at a pixel connected to the discrimination portion during a plurality of first predetermined time intervals during a predetermined time period and during a plurality of second predetermined time intervals during the predetermined time period; and
a counting portion for counting the number of times that the detection portion detects reception of light during the first predetermined time intervals and during the second predetermined time intervals during the predetermined time period, and
the discrimination portion is configured to determine whether each pixel receives measurement light or the ambient light based solely on a counting result of the counting portion.

2. The distance measuring device according to claim 1, wherein the pixel output control portion is configured to enable output of the light reception signal of those pixels for which the discrimination portion determines that measurement light is received.

3. The distance measuring device according to claim 1, wherein the discrimination portion is configured to determine that a pixel receives measurement light if a count of the number of times that the detection portion detects a reception of light during the first predetermined time intervals during the predetermined time period differs from the count of the number of times that the detection portion detects reception of light during the second predetermined time intervals during the predetermined time period by at least a predetermined comparison threshold.

4. The distance measuring device according to claim 1, wherein the discrimination portion is configured to determine that a pixel does not receive measurement light if the count of the number of times that the detection portion detects reception of light during the first predetermined time intervals during the predetermined time period differs from the count of the number of times that the detection portion detects reception of light during the second predetermined time intervals during the predetermined time period by less than the predetermined comparison threshold.

5. The distance measuring device according to claim 1, wherein the discrimination portion is configured to determine that a pixel receives measurement light if the number of times that the detection portion detects reception of light during the first predetermined time intervals during the predetermined time period is smaller than an absolute or self-adjusting threshold and if the number of times that the detection portion detects reception of light during the second predetermined time intervals during the predetermined time period is larger than the absolute or self-adjusting threshold.

6. The distance measuring device according to claim 1, wherein the first predetermined time intervals and/or the second predetermined time intervals are periodic or pseudo-random time intervals.

7. The distance measuring device according to claim 1, further comprising a weighting portion for assigning a first weight to the counts of each first predetermined time interval at which the detection portion detects reception of light and/or for assigning a second weight to the counts of each second predetermined time interval at which the detection portion detects reception of light.

8. The distance measuring device according to claim 7, wherein the counting portion is further configured to sum up the weighted counts of the first predetermined time intervals and to sum up the weighted counts of the second predetermined time intervals.

9. The distance measuring device according to claim 1, wherein a plurality of pixel output control portions are connected to a single evaluation portion.

10. The distance measuring device according to claim 9, wherein the plurality of pixel output control portions are connected to a single discrimination portion.

11. The distance measuring device according to claim 1, wherein a discrimination portion is provided for each of the plurality of pixels.

12. The distance measuring device according to claim 1, wherein the discrimination portion receives the light reception signal of each of a plurality of pixels.

13. The distance measuring device according to claim 12, wherein the plurality of pixels connected to the same discrimination portion are non-adjacent to each other.

14. The distance measuring device according to claim 1, wherein the light receiving portions constituting the pixels are single photon avalanche diodes.

15. A distance measurement method for performing a measurement using the distance measuring device according to claim 1, the method comprising:
   emitting light with the light emission portion;
   receiving measurement light that is emitted by the light emission portion and reflected by the measurement object by the light receiving portion, the light receiving portion comprising a plurality of pixels, each pixel having at least one light receiving portion and being configured to output a light reception signal that depends on the measurement light incident on the pixel;
   discriminating whether the pixel receives the measurement light or only ambient light, and outputting a discrimination result indicating whether the light received by the pixel includes the measurement light or only the ambient light;
   selectively outputting the light reception signal of each pixel individually, depending on the discrimination result of the step of discriminating for each pixel individually whether the pixel receives measurement light; and
   outputting a distance signal that is indicative of a distance between the measuring device and the measurement object based on the received light reception signals.

16. The distance measuring device according to claim 1, wherein the discrimination portion is configured to determine whether each pixel at a given location receives the measurement light or only the ambient light based solely on the counting result of the counting portion measurement light or only ambient light.

17. The distance measuring device according to claim 1, wherein the detection portion is further for detecting whether light is received at the pixel connected to the discrimination portion during the plurality of first predetermined time intervals, at which either the measurement light or only the ambient light is received, during the predetermined time period and during the plurality of second predetermined time intervals, at which either the measurement light or only the ambient light is received, during the predetermined time period; and the counting portion is further for counting the number of times that the detection portion detects reception of light during the first predetermined time intervals and during the second predetermined time intervals during the predetermined time period.

* * * * *